United States Patent
Markanday et al.

(10) Patent No.: US 12,281,223 B2
(45) Date of Patent: Apr. 22, 2025

(54) PIEZOELECTRIC COMPOSITE MATERIAL AND METHOD

(71) Applicant: SABIC Global Technologies B.V., Bergen op Zoom (NL)

(72) Inventors: Meghna Markanday, Bangalore (IN); Pradeep Singh, Bangalore (IN); Venkata Ramanarayanan Ganapathy Bhotla, Bangalore (IN); Nandini D R, Bangalore (IN); Suresh Velate, Bangalore (IN)

(73) Assignee: SABIC Global Technologies B.V., Bergen op Zoom (NL)

( * ) Notice: Subject to any disclaimer, the term of this patent is extended or adjusted under 35 U.S.C. 154(b) by 294 days.

(21) Appl. No.: 18/007,413

(22) PCT Filed: Jul. 7, 2021

(86) PCT No.: PCT/IB2021/056064
§ 371 (c)(1),
(2) Date: Jan. 30, 2023

(87) PCT Pub. No.: WO2022/034390
PCT Pub. Date: Feb. 17, 2022

(65) Prior Publication Data
US 2023/0331972 A1 Oct. 19, 2023

Related U.S. Application Data

(60) Provisional application No. 63/063,499, filed on Aug. 10, 2020.

(51) Int. Cl.
| | |
|---|---|
| C08L 27/16 | (2006.01) |
| C08J 3/21 | (2006.01) |
| C08J 5/18 | (2006.01) |
| C08K 3/22 | (2006.01) |
| H10N 30/092 | (2023.01) |
| H10N 30/85 | (2023.01) |

(52) U.S. Cl.
CPC ............ C08L 27/16 (2013.01); C08J 3/212 (2013.01); C08J 5/18 (2013.01); C08K 3/22 (2013.01); H10N 30/092 (2023.02); H10N 30/852 (2023.02); C08J 2327/16 (2013.01); C08J 2401/02 (2013.01); C08K 2003/2244 (2013.01); C08K 2201/001 (2013.01); C08L 2203/16 (2013.01); C08L 2203/20 (2013.01); C08L 2205/16 (2013.01)

(58) Field of Classification Search
CPC ............ C08J 5/005; C08J 5/045–5/046; C08J 2301/02–2301/12; C08J 2327/12–2327/20; H10N 30/00–30/886
See application file for complete search history.

(56) References Cited

U.S. PATENT DOCUMENTS

| | | |
|---|---|---|
| 2017/0018700 A1 | 1/2017 | Miyoshi et al. |
| 2018/0316995 A1 | 11/2018 | Miyoshi |

FOREIGN PATENT DOCUMENTS

| | | |
|---|---|---|
| EP | 0208019 A2 | 1/1987 |
| WO | WO2018085936 A1 | 5/2018 |

OTHER PUBLICATIONS

Weliky et al. "The Chemistry and IJSE of Cellulose Derivatives for the Study of Bioloctical Systems", Jet Propulsion Laboratory, (1965); pp. 1-57.*
Jaffe et al. "Piezoelectric Properties of Lead Zirconate-Lead Titanate Solid-Solution Ceramics", Journal of Applied Physics, 25, (1954); pp. 809-810.*
Klein et al. "Influence of composition on relaxor ferroelectric and electromechanical properties of poly(vinylidene fluoride-trifluoroethylene-chlorofluoroethylene)", Journal of Applied Physics, 97, (2005); pp. 094105-1 to 094105-4.*
S. K. Mahadeva, Piezoelectric Paper Fabricated via Nanostructured Barium Titanate Functionalization of Wood Cellulose Fibers, ACS Appl. Mater. Interfaces 2014, 6, 7547-7553.
International Search Report and Written Opinion dated Oct. 5, 2021 in counterpart International PCT Application No. PCT/IB2021/056064.

* cited by examiner

*Primary Examiner* — Prashant J Khatri
(74) *Attorney, Agent, or Firm* — Grady K. Bergen; Griggs Bergen LLP; Robert E. Holthus

(57) ABSTRACT

A piezoelectric composite material is formed from a cellulosic material and an inorganic piezoelectric material dispersed in a piezoelectric polymer. The piezoelectric polymer of the composite material has a dielectric constant of from 10 or more. A method of making a piezoelectric is also disclosed wherein a matrix of a cellulosic material, an inorganic piezoelectric material, and a piezoelectric polymer material is formed. The matrix is formed into a piezoelectric composite body.

18 Claims, 3 Drawing Sheets

PIEZOELECTRIC COMPOSITE MATERIAL AND METHOD

TECHNICAL FIELD

The invention relates to piezoelectric composite materials, and their method of manufacture and use.

BACKGROUND

Piezoelectric materials are those materials that produce an electrical charge when subjected to mechanical stress. Such materials are useful in a variety of different applications. These include transducers, sensors, actuators, printers, speakers, and other applications.

There are several types of piezoelectric materials. These include ceramic materials, crystals, polymers and polymer composites. While these materials are useful they each have certain drawbacks.

Piezoelectric ceramic materials typically include perovskite mineral materials. The perovskite family comprises the largest class of piezoelectric ceramics that are used in transducer technology today. Typical examples of piezoelectric ceramics with the perovskite structure include barium titanate ($BaTiO_3$), lead titanate ($PbTiO_3$), lead zirconate titanate ($Pb(Zr_xTi_{1-x})O_3$, or PZT), lead lanthanum zirconate titanate ($Pb_{1-x}La_x(Zr_yT_{1-y})_{1-x/4}O_3$, or PLZT), and lead magnesium niobate-lead titanate ($Pb(Mg_{1/3}Nb_{2/3}O_3)$—$PbTiO_3$, or PMN-PT), among others. After the independent discovery of ferroelectricity in $BaTiO_3$ ceramics in the 1940's in various parts of the world, a large array of ceramic ferroelectric compounds and solid solutions have been synthesized. Particularly, lead zirconate titanate (PZT), a binary solid solution of $PbZrO_3$ (PZ—anti-ferroelectric), and PT (PT—a ferroelectric), has found widespread use in transducer technology because of its remarkable piezoelectric properties.

Ceramics are less expensive and easier to fabricate than piezoelectric polymers or single piezoelectric crystals. Ceramics also have relatively high dielectric constants as compared to polymers and good electromechanical coupling coefficients. On the other hand, ceramics are disadvantageous due to their high acoustic impedance, which results in poor acoustic matching with media such as water and human tissue—the media through which it is typically transmitting or receiving a signal. In addition, ceramics exhibit high stiffness and brittleness; and cannot be formed onto curved surfaces, which contributes to limited design flexibility in transducers. Finally, the electromechanical resonances of piezoelectric ceramics give rise to a high degree of noise, which is an unwanted artifact in the context of transducer engineering.

The piezoelectric effect in crystals was discovered in 1880 by two French physicists, brothers Pierre and Paul-Jacques Curie. The effect was found in crystals of quartz, tourmaline, and Rochelle salt (potassium sodium tartrate). Recently, there has been a growing interest in high Curie temperature systems, with special emphasis on single crystals. Materials such as lead metaniobate ($PbNb_2O_6$) or relaxor systems such as $Pb(Sc_{1/2}Nb_{1/2})O_3$—$PbTiO_3$, $Pb(In_{1/2}Nb_{1/2})O_3$—$PbTiO_3$ and $Pb(Yb_{1/2}Nb_{1/2})O_3$—$PbTiO_3$ have been investigated, among others. Also, compositions in the $(1-2x)BiScO_3$-$xPbTiO_3$ ferroelectric family were studied. The major driver for this line of research in ferroelectric materials is the sensor/actuator needs of the automotive industry. As for the case of ceramics above, any one single piezoelectric material phase (ceramic or crystal or polymer) does not provide all of the desired features for an application, and the performance is thereby limited by the trade-off between high piezoelectric activity and low density with mechanical flexibility.

Piezoelectric polymers include polyvinylidene fluoride (PVDF). PVDF is a semi-crystalline polymer that exists in four different phases, i.e., α, β, γ and δ. Of the four distinct phases that PVDF can assume, the β-phase is the only one that exhibits a spontaneous polarization, and thus piezoelectricity. PVDF can be used as a homopolymer or as copolymers, such as poly(vinylidene fluoride-co-trifluoroethylene) (PVDF-TrFE) and poly(vinylidene fluoride-trifluoroethylene-chlorofluoroethylene) (PVDF-TrFE-CFE).

PVDF polymers offer unique advantages over ceramics and crystals. They are flexible and therefore can be formed easily on to curved surfaces. Further, PVDF is chemically inert, tough, creep resistant, and has good stability when exposed to sunlight. In addition, it has a low density along with low dielectric permittivity resulting in a very high voltage coefficient. Due to its excellent mechanical flexibility, biocompatibility, and solution based processability, it is actively being investigated for applications including non-volatile low-voltage memory, acoustic transducers and implantable medical devices.

PVDF and its copolymers (i.e., PVDF-TrFE, PVDF-TrFE-CFE) are some of the best standards when it comes to piezoelectric polymer performance, yet it is difficult to fabricate these polymers into individual active elements, complex architectures, or three-dimensional (3D) patterns. PVDF also has several inherent disadvantages that make its use limited; such as low piezoelectric coefficient (d33) and piezoelectric charge coefficient (dh) values, and low dielectric constant. Also, PVDF film requires a high electric field for poling and makes the poling slightly difficult. Despite their high dielectric breakdown values, the low piezoelectric voltage constant makes them inapt for applications like energy harvesting.

Heterostructural materials, such as polymer ceramic composites (PVDF-PZT), have received a lot of attention since these materials can combine the excellent pyroelectric and piezoelectric properties of ceramics with the strength of polymers, flexibility, processing facility, levity, relatively high dielectric permittivity, and breakdown strength, which are not attainable in a single phase piezoelectric material. These properties make composites made of electroactive ceramics and a ferroelectric polymer very attractive for applications as they exhibit low acoustic impedance matching with water and human skin and their properties can be tailored to various requirements.

Typically, piezoelectric composites contain high loading of inorganic fillers (>25%, v/v), thereby compromising their mechanical properties and flexibility. Thus, there is still enough room for research to develop and fine tune composites with a balance of desired piezoelectric performance with the mechanical flexibility.

SUMMARY

A piezoelectric composite material comprises a cellulosic material and an inorganic piezoelectric material dispersed in a piezoelectric polymer, the piezoelectric polymer having a dielectric constant of from 10 or more.

In certain embodiments, the cellulosic material is cellulosic fibers. The fibers may have a length of from 5 μm to 100 μm and a width of from 5 μm to 40 μm. The cellulosic material may be present in an amount of from 0.01 wt % to 10 wt % based upon the total weight of the composite material.

The inorganic piezoelectric material may be present in an amount of from 20 wt % to 90 wt % based upon the total volume of the composite material. The inorganic piezoelectric material may be selected from at least one of barium titanate ($BaTiO_3$), potassium sodium niobate (KNN), zinc oxide, lead titanate ($PbTiO_3$), lead zirconate titanate (PZT), lead lanthanum zirconate titanate (PLZT), lead magnesium niobate-lead titanate (PMN-PT), hydroxyapatite, apatite, lithium sulfate monohydrate, sodium potassium niobate, quartz, tartaric acid, poly(vinylidene difluoride), and a binary solid solution of anti-ferroelectric material and a ferroelectric material. The ferroelectric component may be selected from at least one of barium titanium oxide (BTO), lead zirconium titanate (PZT), potassium sodium niobate (KNN), polyvinylidene difluoride (PVDF), polyvinylidene difluoride trifluoroethylene (P(VDF-TrFE)), polyvinylidene difluoride hexafluoropropylene (P(VDF-HFP)), polyvinylidene difluoride trifluoroethylene chlorofluoroethylene (P(VDF-TrFE-CFE)) 2-methylbenzimidazole, diisopropylammonium chloride, diisopropylammonium bromide, croconic acid, and tetrathiafulvalene-pyromellitic diimide (TTF-PMDI) salts.

The piezoelectric polymer may be a fluoropolymer. The piezoelectric polymer may be a polyvinylidene fluoride (PVDF) polymer or PVDF copolymer. In certain embodiments, the piezoelectric polymer is a PVDF-TrFE-CFE polymer.

The composite material may be formed as a film. The film may have a thickness of from 30 µm to 120 µm. The composite material may have a piezoelectric constant d33 of from 35 pC/N or more.

The composite material may be a piezoelectric device. The device may be at least one of a piezoelectric sensor, a piezoelectric transducer, and a piezoelectric actuator.

In a method of making a piezoelectric composite material, a matrix of a cellulosic material, an inorganic piezoelectric material, and a piezoelectric polymer material is formed. The piezoelectric polymer may have a dielectric constant of from 10 or more. The matrix is formed into a piezoelectric composite body.

In certain embodiments, the cellulosic material is cellulosic fibers. The fibers may have a length of from 5 µm to 100 µm and a width of from 5 µm to 40 µm. The cellulosic material may be present in an amount of from 0.01 wt % to 10 wt % based upon the total weight of the composite material.

The inorganic piezoelectric material may be present in an amount of from 20 wt % to 90 wt % based upon the total volume of the composite material. The inorganic piezoelectric material may be selected from at least one of barium titanate ($BaTiO_3$), potassium sodium niobate (KNN), zinc oxide, lead titanate ($PbTiO_3$), lead zirconate titanate (PZT), lead lanthanum zirconate titanate (PLZT), lead magnesium niobate-lead titanate (PMN-PT), hydroxyapatite, apatite, lithium sulfate monohydrate, sodium potassium niobate, quartz, tartaric acid, poly(vinylidene difluoride), and a binary solid solution of anti-ferroelectric material and a ferroelectric material. The ferroelectric component may be selected from at least one of barium titanium oxide (BTO), lead zirconium titanate (PZT), potassium sodium niobate (KNN), polyvinylidene difluoride (PVDF), polyvinylidene difluoride trifluoroethylene (P(VDF-TrFE)), polyvinylidene difluoride hexafluoropropylene (P(VDF-HFP)), polyvinylidene difluoride trifluoroethylene chlorofluoroethylene (P(VDF-TrFE-CFE)) 2-methylbenzimidazole, diisopropylammonium chloride, diisopropylammonium bromide, croconic acid, and tetrathiafulvalene-pyromellitic diimide (TTF-PMDI) salts.

The piezoelectric polymer may be a fluoropolymer. The piezoelectric polymer may be a polyvinylidene fluoride (PVDF) polymer or PVDF copolymer. In certain embodiments, the piezoelectric polymer is a PVDF-TrFE-CFE polymer.

The piezoelectric composite body may be formed as a film. The film may have a thickness of from 30 µm to 120 µm. The composite material may have a piezoelectric constant d33 of from 35 pC/N or more.

The piezoelectric composite body may be a piezoelectric device. The device may be at least one of a piezoelectric sensor, a piezoelectric transducer, and a piezoelectric actuator.

In a further method of producing a piezoelectric composite steps (a) through (c) are carried out where (a) is obtaining a solution of a piezoelectric polymer material containing an amount of cellulosic material, (b) is dispersing a piezoelectric additive in the solution, and (c) is subjecting the dispersion of step (b) to conditions suitable to form a piezoelectric composite material.

In particular embodiments, step (c) includes steps (i) through (iii) where (i) is solvent casting the dispersion on a substrate by either doctor blade or spin-coating, (ii) is air/drying/heat treating the step (i) dispersion to form a composite, and (iii) is applying a poling field to the composite to form a piezoelectric composite.

BRIEF DESCRIPTION OF THE DRAWINGS

For a more complete understanding of the embodiments described herein, and the advantages thereof, reference is now made to the following descriptions taken in conjunction with the accompanying figures, in which.

DETAILED DESCRIPTION

Figure 1:
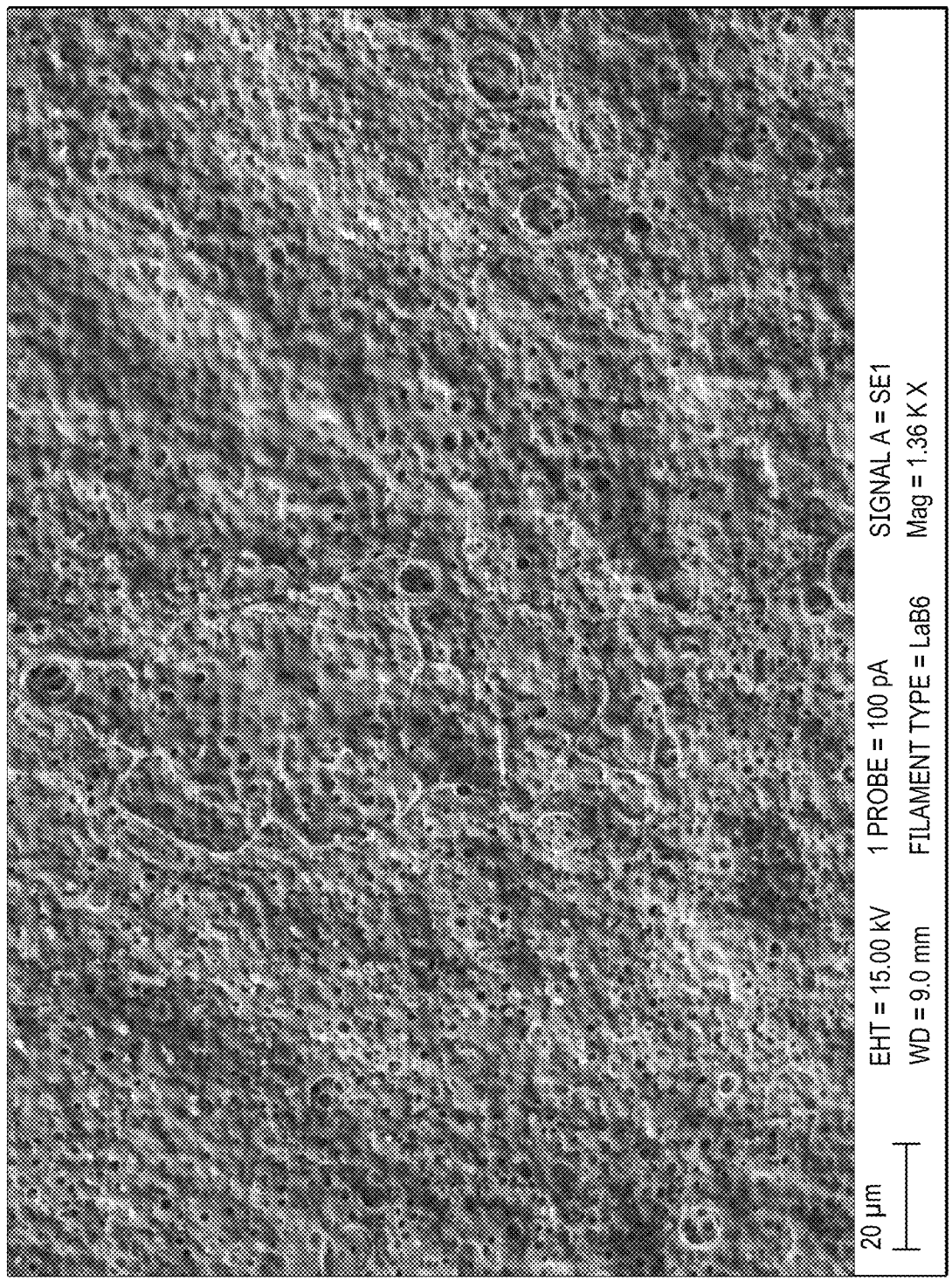
FIG. 1 is a scanning electron microscope (SEM) image of Sample 2 of Example 2 at 1.36K× magnification, showing the dispersion of cellulose fibers in a polymer matrix.

Wood cellulose is known to exhibit inherent piezoelectricity like other widely known and used materials, such as quartz, perovskites (e.g., $BaTiO_3$, PZT), etc. Use of such cellulose in piezoelectric applications would be greatly beneficial in terms of its cost and environmental friendliness. While there has been research in developing a cellulose-based substrate for various sensing devices, most methods so far are based on approaches and methods that may be very tedious and far from practical scalability due to reproducibility and manufacturing issues.

By utilizing cellulosic material in accordance with those embodiments disclosed herein, a flexible piezoelectric material that has good piezoelectric properties can be produced at low cost and in a simple and scalable process. Specifically, the cellulosic material is used in combination with an inorganic piezoelectric material and a piezoelectric polymer. This is achieved by dispersing the cellulosic material and inorganic piezoelectric material in a matrix of the polymer material.

Cellulose is an organic compound with the formula $(C_6H_{10}O_5)_n$. It is a polysaccharide consisting of a linear chain of several hundred to many thousands of β-linked D-glucose units. Cellulose is an important structural component of the primary cell wall of green plants, many forms of algae and the oomycetes. A cellulose molecule may be from several hundred to over 10,000 glucose units long.

In most applications, the cellulose used will be in the form of cellulose fibers. Such fibers are made with ethers or esters of cellulose, which can be obtained from the bark, wood or leaves of plants, or from other plant-based material.

The fibers are elongated bodies having aspect ratio (i.e., length to width) of from 50:1 to 2:1, more typically from 3:1 to 2:1. The cellulose fibers may have an overall length of from 5 μm to 100 μm and a width or thickness of from 2 μm to 40 μm. In certain embodiments, the cellulose fibers may have an overall length of from 10 μm to 70 μm and a thickness of from 5 μm to 30 μm. In particular embodiments, the cellulose fiber may have an overall length of from at least, equal to, and/or between any two of 5 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, and 100 μm. Further, the cellulose fiber may have a width or thickness of from at least, equal to, and/or between any two of 2 μm, 3 μm, 4 μm, 5 μm, 6 μm, 7 μm, 8 μm, 9 μm, 10 μm, 15 μm, 20 μm, 25 μm, 30 μm, 35 μm, and 40 μm.

It should be noted in the description, if a numerical value, concentration or range is presented, each numerical value should be read once as modified by the term "about" (unless already expressly so modified), and then read again as not so modified unless otherwise indicated in context. Also, in the description, it should be understood that an amount range listed or described as being useful, suitable, or the like, is intended that any and every value within the range, including the end points, is to be considered as having been stated. For example, "a range of from 1 to 10" is to be read as indicating each and every possible number along the continuum between about 1 and about 10. Thus, even if specific points within the range, or even no point within the range, are explicitly identified or referred to, it is to be understood that the inventor appreciates and understands that any and all points within the range are to be considered to have been specified, and that inventor possesses the entire range and all points within the range.

The cellulose fiber material may be used in an amount of from 1 wt % to 10 wt % based upon the total weight of the piezoelectric composite material. In certain embodiments, the cellulose fiber may be used in an amount of from at least, equal to, and/or between any two 1.0 wt %, 1.1 wt %, 1.2 wt %, 1.3 wt %, 1.4 wt %, 1.5 wt %, 1.6 wt %, 1.7 wt %, 1.8 wt %, 1.9 wt %, 2.0 wt %, 2.1 wt %, 2.2 wt %, 2.3 wt %, 2.4 wt %, 2.5 wt %, 2.6 wt %, 2.7 wt %, 2.8 wt %, 2.9 wt %, 3.0 wt %, 3.1 wt %, 3.2 wt %, 3.3 wt %, 3.4 wt %, 3.5 wt %, 3.6 wt %, 3.7 wt %, 3.8 wt %, 3.9 wt %, 4.0 wt %, 4.1 wt %, 4.2 wt %, 4.3 wt %, 4.4 wt %, 4.5 wt %, 4.6 wt %, 4.7 wt %, 4.8 wt %, 4.9 wt %, 5.0 wt %, 5.1 wt %, 5.2 wt %, 5.3 wt %, 5.4 wt %, 5.5 wt %, 5.6 wt %, 5.7 wt %, 5.8 wt %, 5.9 wt %, 6.0 wt %, 6.1 wt %, 6.2 wt %, 6.3 wt %, 6.4 wt %, 6.5 wt %, 6.6 wt %, 6.7 wt %, 6.8 wt %, 6.9 wt %, 7.0 wt %, 7.1 wt %, 7.2 wt %, 7.3 wt %, 7.4 wt %, 7.5 wt %, 7.6 wt %, 7.7 wt %, 7.8 wt %, 7.9 wt %, 8.0 wt %, 8.1 wt %, 8.2 wt %, 8.3 wt %, 8.4 wt %, 8.5 wt %, 8.6 wt %, 8.7 wt %, 8.8 wt %, 8.9 wt %, 9.0 wt %, 9.1 wt %, 9.2 wt %, 9.3 wt %, 9.4 wt %, 9.5 wt %, 9.6 wt %, 9.7 wt %, 9.8 wt %, 9.9 wt %, and 10.0 wt %.

The cellulose fiber material is used in combination with an inorganic piezoelectric material. The inorganic piezoelectric material may be piezoelectric ceramic and/or piezoelectric crystalline materials. Such materials may have a piezoelectric coefficient (d33) that ranges from 50 pC/N to 1000 pC/N, more particularly from 150 pC/N to 800 pC/N. The inorganic piezoelectric materials may also have a dielectric constant of from 1000 to 5000, more particularly from 1200 to 4500. Such inorganic piezoelectric material may be in the form of particles having a particle size ranging from 0.1 μm to 2.0 μm. Such particles are discrete particles that may be characterized as being "zero-dimensional" in that they do not have a significant length in comparison to the cellulose fibers used in the composite materials. In certain embodiments, the inorganic piezoelectric material may have a particle size of from at least, equal to, and/or between any two of 0.1 μm, 0.2 μm, 0.3 μm, 0.4 μm, 0.5 μm, 0.6 μm, 0.7 μm, 0.8 μm, 0.9 μm, 1.0 nm, 1.1 μm, 1.2 μm, 1.3 μm, 1.4 μm, 1.5 μm, 1.6 μm, 1.7 μm, 1.8 μm, 1.9 μm, and 2.0 μm.

Non-limiting examples of suitable inorganic piezoelectric materials include the piezoelectric ceramics with the perovskite structure. These include barium titanate ($BaTiO_3$), lead titanate ($PbTiO_3$), lead zirconate titanate ($Pb(Zr_xTi_{1-x})O_3$, or PZT), lead lanthanum zirconate titanate ($Pb_{1-x}La_x(Zr_yT_{1-y})_{1-x}/4O_3$, or PLZT), and lead magnesium niobate-lead titanate ($Pb(Mg_{1/3}Nb_{2/3}O_3)$—$PbTiO_3$, or PMN-PT), hydroxyapatite, apatite, lithium sulfate monohydrate, sodium potassium niobate, quartz, tartaric acid, poly (vinylidene difluoride) fibers or combinations thereof. Other piezoelectric materials include binary solid solutions of anti-ferroelectric material and a ferroelectric materials, such as $PbZrO_3$ (PZ—anti-ferroelectric), and PT (PT—a ferroelectric).

The ferroelectric component may be selected from barium titanium oxide (BTO), lead zirconium titanate (PZT), potassium sodium niobate (KNN), polyvinylidene difluoride (PVDF), polyvinylidene difluoride trifluoroethylene (P(VDF-TrFE)), polyvinylidene difluoride hexafluoropropylene (P(VDF-HFP)), polyvinylidene difluoride trifluoroethylene chlorofluoroethylene (P(VDF-TrFE-CFE)) 2-methylbenzimidazole, diisopropylammonium chloride, diisopropylammonium bromide, croconic acid, TTF-PMDI salts and mixtures thereof. In certain applications, the ferroelectric component is selected from barium titanium oxide (BTO), lead zirconate titanate (PZT), polyvinylidene difluoride trifluoroethylene (P(VDF-TrFE)) and mixtures of these materials.

The inorganic piezoelectric material may be present in the piezoelectric composite material in an amount of from 10 vol % to 70 vol % based upon the total volume of the composite material. In particular embodiments, the inorganic piezoelectric material may be present in the composite material an amount of from at least, equal to, and/or between any two of 10 vol %, 11 vol %, 12 vol %, 13 vol %, 14 vol %, 15 vol %, 16 vol %, 17 vol %, 18 vol %, 19 vol %, 20 vol %, 21 vol %, 22 vol %, 23 vol %, 24 vol %, 25 vol %, 26 vol %, 27 vol %, 28 vol %, 29 vol %, 30 vol %, 31 vol %, 32 vol %, 33 vol %, 34 vol %, 35 vol %, 36 vol %, 37 vol %, 38 vol %, 39 vol %, 40 vol %, 41 vol %, 42 vol %, 43 vol %, 44 vol %, 45 vol %, 46 vol %, 47 vol %, 48 vol %, 49 vol %, 50 vol %, 51 vol %, 52 vol %, 53 vol %, 54 vol %, 55 vol %, 56 vol %, 57 vol %, 58 vol %, 59 vol %, 60 vol %, 61 vol %, 62 vol %, 63 vol %, 64 vol %, 65 vol %, 66 vol %, 67 vol %, 68 vol %, 69 vol %, and 70 vol %, based upon the total volume of the composite material.

The cellulosic material and the inorganic piezoelectric additive material are dispersed in a piezoelectric polymer matrix. The piezoelectric polymer is that having a dielectric constant of from 10 or more. In particular embodiments, the piezoelectric polymer may have a dielectric constant of from 1 to 60, more particularly from 10 to 50.

The piezoelectric polymer is typically a fluoropolymer. Such fluoropolymers may include polyvinylidene fluoride (PVDF) homopolymer or a PVDF copolymer. PVDF copolymers may include poly(vinylidene fluoride-co-trifluoroethylene) (i.e., PVDF-TrFE) and poly(vinylidene fluoride-trifluoroethylene-chlorofluoroethylene) (i.e., PVDF-TrFE-CFE). Each of these materials may be used by themselves for the piezoelectric polymer. In particular applications, PVDF-TrFE-CFE is used as the piezoelectric polymer. PVDF-TrFE-CFE may have a dielectric constant of 40-50, making it particularly well suited for the piezoelectric polymer. In particular embodiments, the fluorinated polymers (e.g., PVDF, PVDF-TrFE, PVDF-TrFE-CFE, PVDF-HFP, PVDF-TrFE-CTFE) may possess dielectric constants ranging from 10 to 50.

A combination of PVDF homopolymer and PVDF copolymers may also be used as a blend or mixture for the piezoelectric polymer. In such cases, the PVDF homopolymer may be used in such mixture in an amount of from 1 wt % to 99 wt % by total weight of the piezoelectric polymer, with the balance being PVDF copolymers. Additionally, different PDVF copolymers (e.g., both PVDF-TrFE and PVDF-TrFE-CFE) may be used as a mixture for the piezoelectric polymer, with each different copolymer being present in the mixture in an amount of from 1 wt % to 99 wt % by total weight of the piezoelectric polymer. The piezoelectric polymer material is used in an amount of from 30 vol % to 90 vol % by total of the composite material. In particular embodiments, the piezoelectric polymer material is used in an amount of from 40 vol % to 60 vol % by total volume of the composite material.

In forming the piezoelectric composite material, the selected amounts of cellulosic material and inorganic piezoelectric material are combined and dispersed into a piezoelectric polymer matrix. The matrix containing the cellulose and inorganic piezoelectric material is then formed into a desired piezoelectric composite body. This may be a film or other non-film composite material. Various methods may be used to form the piezoelectric composite materials such as polymer solution casting, melt processing, spin coating, tape casting, dip coating, etc.

In particular embodiments of forming the polymer matrix, polymer solution casting is used wherein the piezoelectric polymer may be initially dissolved in a suitable solvent. The solvent may be that capable of readily dissolving the piezoelectric polymer. The solvent may also have good wettability with the cellulose and inorganic piezoelectric materials to facilitate their dispersion in the dissolved polymer solution. Non-limiting examples of suitable solvents include tetrahydrofuran (THF), methyl ethyl ketone (MEK), N, N-dimethyl formamide (DMF), etc. and combinations of such solvents. THE has been found to be a particularly well-suited solvent.

The amount of solvent used may be that sufficient to dissolve the polymer and sufficiently disperse the cellulose and inorganic piezoelectric additives to form the matrix solution. In particular embodiments, the amount of solvent may range from 10 Vol % to 60 vol %.

The polymer solution with the selected amount of polymer dissolved may be first formed, with the cellulose and inorganic piezoelectric material being added to this while mixing. The desired amount of cellulose and inorganic material may then be combined gradually, either sequentially one after another or both together, with the polymer solution with mixing. In certain instances, the desired amount cellulosic material is added to the polymer solution first so that it is dispersed throughout the solution. To this is then added the inorganic piezoelectric material, which is also dispersed throughout the solution through mixing.

After the polymer and cellulosic and inorganic piezoelectric are sufficiently dispersed in the solution, the polymer solution may be cast or otherwise formed into a desired body. This may be done through the polymer solution casting or spin coating techniques. In particular embodiments, the polymer solution may be cast as a thin film on a glass plate using a doctor blade or using spin coating to form a thin film or membrane composite body. In many applications, the piezoelectric composite material will be formed into a thin film.

The cast body (e.g., films) may then be dried, such as through air drying, and heat treated or annealed. In certain embodiments, the cast body is subjected to annealing by heating at from 100° C. to 150° C. for from 5-10 hr in air for overall improvement of the piezoelectric properties. Typical heating or annealing temperatures range from 100° C. to 150° C. This also drives off any solvents from the composite material.

The composite material may then be subjected to a poling field to form the final piezoelectric composite material. The process of poling is the process of reorientation of the crystallites (or, molecular dipoles) within the polymer bulk medium through the application of a high electric field at an elevated temperature. In order to sustain the orientation state of the molecular dipoles, the temperature of the material is brought down in the presence of the electric field. The two most commonly used methods are electrode poling and corona poling. Corona poling provides an advantage of not having contacting electrodes and thus, capacity to pole large surfaces in a continuous fashion. In many applications corona poling is used to form the final piezoelectric composite material. The final quality of alignment of crystallites (and consequently the piezoelectric coefficient, d) depends on the strength and time of the applied electric field, the value and degree of uniformity of the temperature applied on the polymer and the degree of contamination or voids between the electrodes and the polymer surface. Typically, the temperature for both methods of poling does not exceed 300° C.

In particular embodiments, the composite material is subjected to corona poling at temperatures of from 100° C. to 150° C. (e.g., 110° C.) for a period of from 10 min to 20 hours (e.g., 30 min) followed by cooling (e.g., 30 min-45 min) under the applied electric field (e.g., from 8 kV to 10 kV).

The piezoelectric composite may also be subjected to electrode poling in certain embodiments. This is done by depositing metal electrodes on the films at a thickness of from 20 nm to 50 nm. The metal electrodes may be formed from gold, platinum, silver, etc.

The resulting piezoelectric composite film may have a thickness of from 30 µm to 120 µm in certain embodiments.

The final piezoelectric composite film may have a film thickness of from at least, equal to, and/or between any two of 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, 105 μm, 110 μm, 115 μm, 120 μm, 125 μm, and 130 μm.

The final composite material may also be characterized by a piezoelectric coefficient or constant (d33) of from 35 pC/N or more. Higher loading of the cellulosic and inorganic piezoelectric materials can increase the piezoelectric constant. In particular embodiments, the piezoelectric composite material may have a piezoelectric constant d33 of from 35 pC/N at low loading levels to as much as 100 pC/N or more at higher loading levels.

The cellulosic fibers are uniformly dispersed within the composite matrix and provide a "one-dimensional" interface for the "zero-dimensional" inorganic piezoelectric materials, which are typically in the form of discrete particles deposited along the cellulosic fibers. Furthermore, the cellulosic fibers have piezoelectric properties themselves. This combination essentially provides a pseudo-one-dimensional alignment of the inorganic piezoelectric (e.g., ceramic) particles. This results in a good conducting pathway through the composite matrix to enable efficient charge transfer from one point to another uniformly across the composite material.

The resulting piezoelectric composite material may be incorporated into a piezoelectric device. Such devices may include piezoelectric sensors, piezoelectric transducers, piezoelectric actuators, printers, speakers, etc.

The following examples serve to further illustrate various embodiments and applications.

EXAMPLES

Example 1

Fabrication of Films

Solution cast films were made using PVDF-TrFE-CFE as the piezoelectric polymer and PZT as a piezoelectric ceramic filler with THF as solvent. The films were made both with and without cellulose fibers. The PZT used was that available as PZT 27 or PZT 5A, which each have similar properties, available from Morgan Advanced Materials, having a particle size of less than 1 micron. The desired amount of PVDF-TrFE-CFE (dielectric constant of 50) was weighed and dissolved in THF to make a 10 wt % solution with constant stirring The PVDF-TrFE-CFE was that available as PIEZOTECH® RT-FS from Arekema Group, with monomer constituents of VDF at 60.5 mol %, TrFE at 31.3 mol % and CFE at 8.2 mol %. Different amounts of cellulose fibers were added to two samples of this polymer solution and stirred further. The cellulose fibers were used in an amount of 1 wt % and 5 wt % based upon the weight of PVDF-TrFE-CFE used. The cellulose was that available as SIGMACELL Cellulose Type 101, highly purified fibers, from Sigma Aldrich. The cellulose fibers had a length of from 10 μm to 70 μm and a width of from 5 μm to 20 μm. The different solutions, with or without cellulose, were added gradually to a weighed amount of ceramic material and stirred for a further few minutes and were then cast with a doctor blade as a thin film on a glass plate.

The obtained films were annealed at 110° C. for 5 hours followed by gold sputtering (50-100 nm thickness) of electrodes and poling (at ~8 KV) as usually done conventionally for piezoelectric films.

The resulting films each had a thickness of approximately 50 μm. Poling was done at 110° C. Table 1 below details the different formulations prepared.

TABLE 1

| Sample | Polymer, PVDF-TrFE-CFE (wt %) | PZT (wt %) | Cellulose Fibers (wt %) |
|---|---|---|---|
| Comparative 1 | 20 | 80 | 0 |
| 2 | 20 | 80 | 1 |
| 3 | 20 | 80 | 5 |

Example 2

SEM Piezoelectric Composite Characterization

Figure 2:
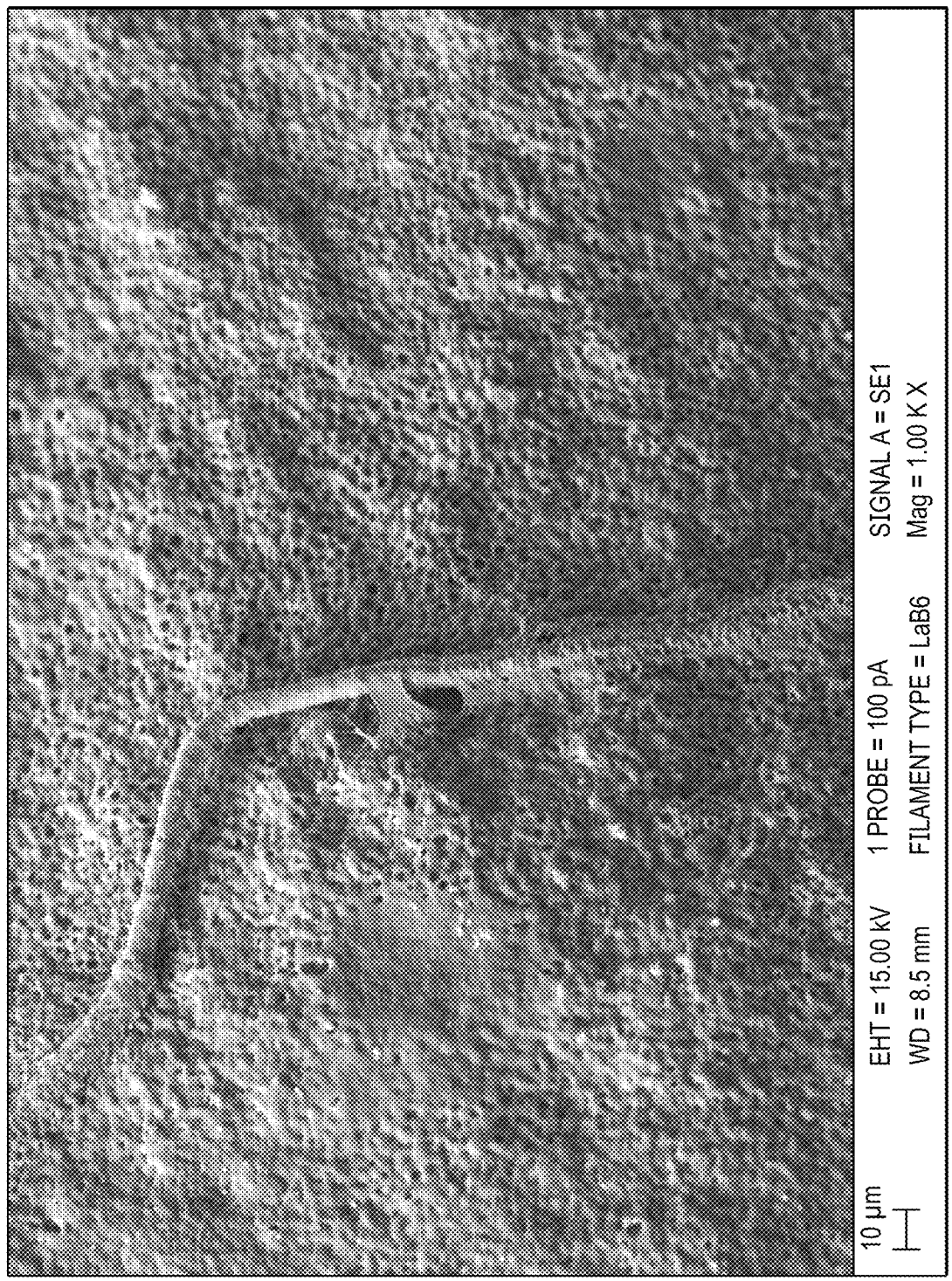
FIG. 2 is an SEM surface image of Sample 2 of Example 2 at 1.00K× magnification, showing the morphology of a single cellulose fiber across the polymer matrix.
Figure 3:
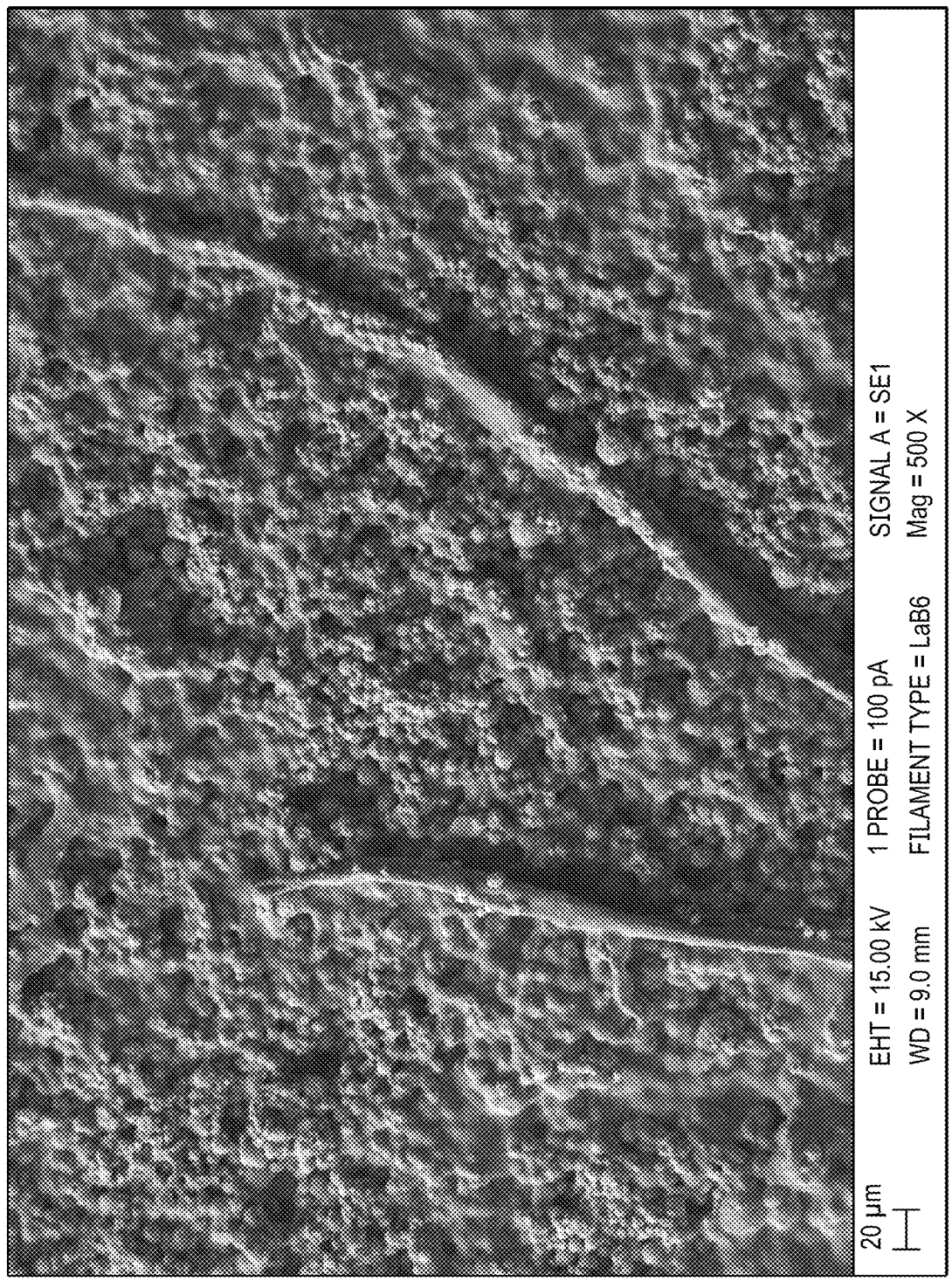
FIG. 3 is an SEM surface image of Sample 2 of Example 2 at 500× magnification, showing morphology of a single cellulose fiber across the polymer matrix.

An SEM study of Sample 2 from Example 1 was carried out using a ZEISS EVO-18 scanning electron microscope. SEM images were taken under secondary electron mode with an operating voltage of 10 kV. All the samples were air cleaned and coated with 10 nm gold prior to imaging. FIG. 1 shows the SEM surface image of Sample 2 at 1.36K× magnification showing the dispersion of cellulose fibers in polymer matrix. FIG. 2 and FIG. 3 show an SEM surface image of Sample 2 at 1.00K× and 500× magnification, respectively, showing morphology of a single cellulose fiber across the polymer matrix.

Example 3

Electrical Properties

A piezometer was used to measure the dielectric constant at 110 Hz frequency for each of the samples from Example 1. The piezoelectric constant (d33-pC/N) was measured by a Piezotest piezometer with an operating frequency of 110 Hz. The dynamic force applied during the measurement was 0.25 N. Both impedance analyzer and piezometer measurement results for each of the samples are presented in Table 2 below.

TABLE 2

| Sample | d33 (pC/N) | Capacitance (pF) |
|---|---|---|
| Comparative 1 | 50 | 89 |
| 2 | 55-60 | 66 |
| 3 | 70-80 | 68 |

From Table 2, the values of d33 (pC/N) measured do not reflect a negative effect resulting from the addition of cellulose fibers to the piezoelectric properties of the composite material. As can be seen, the piezoelectric performance is enhanced from 50 pC/N (i.e., no cellulose fibers) to 70-80 pC/N (i.e., addition of cellulose fibers). A reduced value of capacitance on addition of cellulose fibers indicates that there may be reduced dielectric loss beneficial for achieving higher efficiency in final device.

While the invention has been shown in some of its forms, it should be apparent to those skilled in the art that it is not so limited, but is susceptible to various changes and modifications without departing from the scope of the invention based on experimental data or other optimizations considering the overall economics of the process. Accordingly, it is appropriate that the appended claims be construed broadly and in a manner consistent with the scope of the invention.

We claim:

1. A piezoelectric composite material comprising a cellulosic material and an inorganic piezoelectric material dispersed in a piezoelectric polymer, the piezoelectric polymer having a dielectric constant from 10 or more, wherein the cellulosic material is cellulosic fibers having a length from 5 µm to 100 µm and a width from 5 µm to 40 µm.

2. The composite material of claim 1, wherein:
the cellulosic material is present in an amount from 0.01 wt % to 10 wt % based upon the total weight of the composite material.

3. The composite material of claim 1, wherein:
the inorganic piezoelectric material is present in an amount from 20 wt % to 90 wt % based upon the total volume of the composite material.

4. The composite material of claim 1, wherein:
the piezoelectric polymer is a fluoropolymer.

5. The composite material of claim 1, wherein:
the piezoelectric polymer is a polyvinylidene fluoride (PVDF) polymer or PVDF copolymer.

6. The composite material of claim 1, wherein:
the piezoelectric polymer is a PVDF-TrFE-CFE polymer.

7. The composite material of claim 1, wherein:
the inorganic piezoelectric material is selected from at least one of barium titanate ($BaTiO_3$), potassium sodium niobate (KNN), zinc oxide, lead titanate ($PbTiO_3$), lead zirconate titanate (PZT), lead lanthanum zirconate titanate (PLZT), lead magnesium niobate-lead titanate (PMN-PT), hydroxyapatite, apatite, lithium sulfate monohydrate, sodium potassium niobate, quartz, tartaric acid, poly(vinylidene difluoride), and a binary solid solution of anti-ferroelectric material and a ferroelectric material.

8. The composite material of claim 7, wherein:
the ferroelectric component is selected from at least one of barium titanium oxide (BTO), lead zirconium titanate (PZT), potassium sodium niobate (KNN), polyvinylidene difluoride (PVDF), polyvinylidene difluoride trifluoroethylene (P(VDF-TrFE)), polyvinylidene difluoride hexafluoropropylene (P(VDF-HFP)), polyvinylidene difluoride trifluoroethylene chlorofluoroethylene (P(VDF-TrFE-CFE)) 2-methylbenzimidazole, diisopropylammonium chloride, diisopropylammonium bromide, croconic acid, and tetrathiafulvalene-pyromellitic diimide (TTF-PMDI) salts.

9. The composite material of claim 1, wherein:
the composite material is formed as a film.

10. The composite material of claim 1, wherein:
the film has a thickness from 30 µm to 120 µm.

11. The composite material of claim 1, wherein:
the composite material has a piezoelectric constant d33 from 35 pC/N or more.

12. A piezoelectric device comprising the composite materials of claim 1.

13. The piezoelectric device of claim 12, wherein the device is at least one of a piezoelectric sensor, a piezoelectric transducer, and a piezoelectric actuator.

14. A method of making a piezoelectric composite material comprising:
forming a matrix of a cellulosic material, an inorganic piezoelectric material, and a piezoelectric polymer material, the piezoelectric polymer having a dielectric constant from 10 or more, wherein the cellulosic material is cellulosic fibers having a length from 5 µm to 100 µm and a width from 5 µm to 40 µm; and
forming the matrix into a piezoelectric composite body.

15. The method of claim 14, wherein:
the cellulosic material is present in an amount from 0.01 wt % to 10 wt % based upon the total weight of the composite material and the inorganic piezoelectric material is present in an amount from 20 wt % to 90 wt % based upon the total volume of the composite material.

16. The method of claim 15, wherein:
the piezoelectric polymer is a fluoropolymer.

17. A method of producing the piezoelectric composite of claim 1, the method comprising:
(a) obtaining a solution of a piezoelectric polymer material containing an amount of cellulosic material;
(b) dispersing a piezoelectric additive in the solution; and
(c) subjecting the dispersion of step (b) to conditions suitable to form a piezoelectric composite material.

18. The method of claim 17, wherein step (c) comprises:
(i) solvent casting the dispersion on a substrate by either doctor blade or spin-coating;
(ii) air/drying/heat treating the step (i) dispersion to form a composite; and
(iii) applying a poling field to the composite to form a piezoelectric composite.

* * * * *